United States Patent [19]
Schleich et al.

[11] Patent Number: 6,006,212
[45] Date of Patent: Dec. 21, 1999

[54] TIME-OF-USE AND DEMAND METERING IN CONDITIONS OF POWER OUTAGE WITH A MOBILE NODE

[75] Inventors: Michael G. Schleich, Waseca; Gregory K. Myers, Lakeville, both of Minn.

[73] Assignee: Itron, Inc., Spokane, Wash.

[21] Appl. No.: 08/987,677

[22] Filed: Dec. 9, 1997

Related U.S. Application Data

[60] Provisional application No. 60/059,170, Sep. 17, 1997.

[51] Int. Cl.[6] .................................................. G06F 17/00
[52] U.S. Cl. .............. 705/412; 340/870.02; 340/870.03; 340/870.11
[58] Field of Search ..................... 705/412, 413, 705/417, 418, 400; 702/60, 61, 62, 64, 65; 340/870.02, 870.03, 870.07, 870.11; 324/114, 115, 116, 140 R, 142

[56] References Cited

U.S. PATENT DOCUMENTS

| | | | |
|---|---|---|---|
| D. 332,416 | 1/1993 | Craig et al. | D10/99 |
| D. 362,198 | 9/1995 | Meek | D10/103 |
| 4,400,783 | 8/1983 | Locke, Jr. et al. | 702/58 |
| 4,523,295 | 6/1985 | Zato | 714/22 |
| 4,584,651 | 4/1986 | Carey, Jr. et al. | 364/486 |
| 4,783,623 | 11/1988 | Edwards et al. | 324/156 |
| 4,792,677 | 12/1988 | Edwards et al. | 250/231.13 |
| 4,977,368 | 12/1990 | Munday et al. | 324/142 |
| 5,014,213 | 5/1991 | Edwards et al. | 702/62 |
| 5,027,056 | 6/1991 | Russillo, Jr. et al. | 324/156 |
| 5,034,682 | 7/1991 | Mayo et al. | 324/142 |
| 5,049,810 | 9/1991 | Kirby et al. | 324/156 |
| 5,057,767 | 10/1991 | Keturakis et al. | 324/96 |
| 5,066,906 | 11/1991 | Moore | 324/142 |
| 5,120,252 | 6/1992 | Mayo et al. | 445/22 |
| 5,155,614 | 10/1992 | Carmen et al. | 359/189 |
| 5,270,639 | 12/1993 | Moore | 324/142 |
| 5,311,068 | 5/1994 | Miller | 307/12 |
| 5,363,375 | 11/1994 | Chuang et al. | 370/332 |
| 5,377,114 | 12/1994 | Gross | 705/413 |
| 5,486,864 | 1/1996 | Zdepski | 348/423 |
| 5,495,238 | 2/1996 | Baker et al. | 340/870.02 |
| 5,495,239 | 2/1996 | Ouellett | 340/870.01 |
| 5,553,076 | 9/1996 | Behtash et al. | 370/311 |
| 5,553,094 | 9/1996 | Johnson et al. | 375/200 |
| 5,805,458 | 9/1998 | McNamara et al. | 364/483 |
| 5,808,558 | 9/1998 | Meek et al. | 705/412 |

OTHER PUBLICATIONS

General Electric Type M–90AE™ Demand Register On Type EV/ES Meter Platform Instructions, pp. A–19–A–20.
Edison Electric Institute, Handbook for Electricity Metering, Ninth Edition, pp. 175–178, 190–200, 500–503, 530–535.

*Primary Examiner*—Edward R. Cosimano
*Assistant Examiner*—Thomas A. Dixon
*Attorney, Agent, or Firm*—Patterson & Keough, P.A.

[57] ABSTRACT

An RF based communication system includes a transmitter for transmitting a signal. The transmitter is powered by an external power source and has a transmitter counter for generating a count. The count is linearly incremented over time. The transmitted signal includes the count at the time that the signal is transmitted. A receiver is communicatively coupled to the transmitter for receiving the signal transmitted by the transmitter. The receiver has a receiver counter, the receiver counter being asynchronous with respect to the transmitter counter.

31 Claims, 10 Drawing Sheets

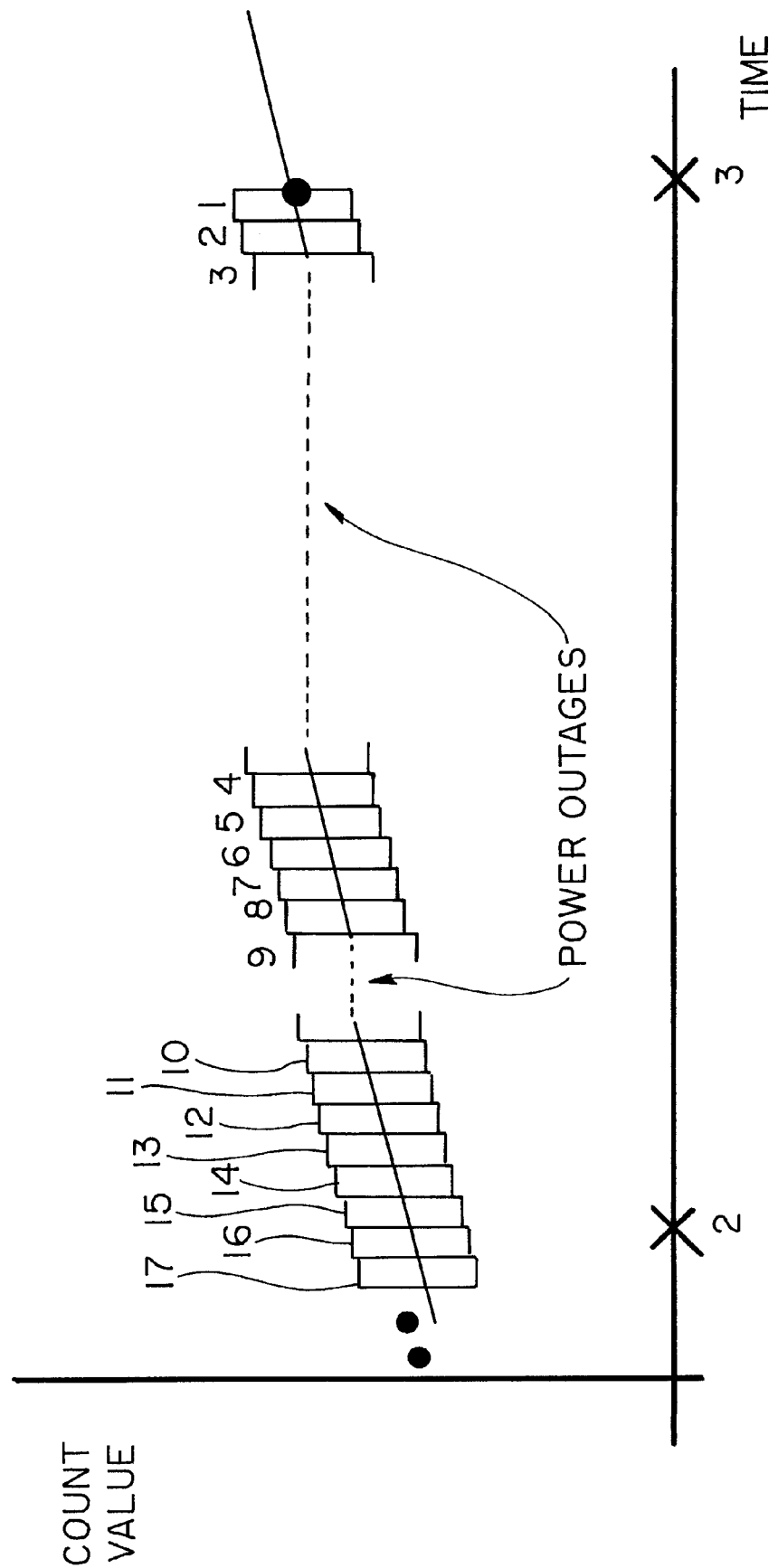

TIME-OF-USE AND DEMAND METERING IN CONDITIONS OF POWER OUTAGE WITH A MOBILE NODE

RELATED APPLICATIONS

This application claims the benefit of U.S. Provisional Application No. 60/059,170, filed Sep. 17, 1997, which is incorporated herein in its entirety by reference.

TECHNICAL FIELD

The present invention relates to the metering of the consumption of electrical energy. More particularly, the present invention relates to providing advanced metering functions when power is temporarily lost at the meter.

BACKGROUND OF THE INVENTION

The advanced metering functions that must be accommodated by a radio frequency (RF) transmitting meter include both demand and time-of-use metering. A review the basics of both demand and time-of-use metering is provided by way of background.

With respect to demand metering, the following paragraph comes from the *Handbook for Electricity Metering*, Edison Electric Institute:

"Kilowatt demand is generally defined as the kilowatt load averaged over a specified interval of time. The meaning of demand can be understood from FIG. 1, which shows an example power curve over time. In any one of the time intervals shown, the area under the dotted line 'demand' is exactly equal to the area under the power curve. Since energy is the product of time and power, either of these two areas represents the energy consumed in the demand interval. The equivalence of the two areas shows that the demand for the interval is that value of power which, if held constant over the interval, will account for the same consumption of energy as the real power. Demand can then be defined as the average of the real power over the interval."

Referring to FIG. 1, the horizontal axis is time and the vertical axis is units of power in kilowatts (kW). Typical electric meters record consumption in units of kilowatt-hours (kWh), which is an energy value. For instance, in a first case an electrical meter would register one kWh consumption if one kW were used constantly for one hour. Similarly, in a second case the meter would show one kWh consumption at the end of an hour if two kW were used constantly for the first half hour with no energy used in a second half hour. Finally, in a third case the meter would also show one kWh consumption at the end of an hour if twelve kW were used constantly for the initial five minutes of the one hour interval and no energy was used in the remaining 55 minutes. FIG. 1 illustrates the foregoing over four demand intervals having a varying power curve. Demand is the area under the dotted line in each of the demand intervals. The area under the dotted line equals the area under the power curve equals total energy for the interval. Demand then for each of the four demand intervals equals the average power over the individual demand intervals.

The aforementioned three cases are depicted in Table 1. The bottom entry in Table 1, labeled "Electric Meter Value Registered at End of Time Period", shows the increase in consumption which would be recorded on the electric meter at the end of each hour for each of the three cases presented. All of the three cases are shown to have the same consumption. From a pure consumption point of view all cases would then have the same electric bill for the one hour demand interval.

TABLE 1

Scenarios Showing Consumption Recorded by an Electric Meter for Different Power Levels and Times of Usage

|  | Case 1 | Case 2 | Case 3 |
|---|---|---|---|
| Constant Power Level | 1 kW | 2 kW | 12 kW |
| Time at Constant Power Usage | 60 minutes | 30 minutes | 5 minutes |
| Time at Zero Power Usage | 0 minutes | 30 minutes | 55 minutes |
| Total Time Period Evaluated | 1 hour | 1 hour | 1 hour |
| Electric Meter Value Registered at End of Time Period | 1 kWh | 1 kWh | 1 kWh |

Demand billing is related to demand as distinct from the aforementioned consumption billing. The electric utility must be geared to meeting demand, not just average consumption. There are a number of different types of demand billing. Block demand is a frequently used form of demand billing. Referring to FIG. 2, time is displayed on the horizontal axis and power is displayed on the vertical axis. As displayed on the horizontal axis there are four intervals, A–D, that comprise a single block. Block demand calculates demand over the intervals A–D comprising the block. Consumption is recorded over the interval and divided by a time period, in hours, that the interval comprises. Repeating this for all the intervals in a block would allow billing based on the average demand over the block. Most often, however, the maximum demand is billed for the entire period of the block. FIG. 2 illustrates the demand for each interval as being indicated by the area under the dashed line. In practice, the maximum demand, depicted in interval C, is the demand that would be billed to the customer over the entire period comprising the block.

Rolling demand is another frequently used form of demand billing. Rolling demand may be thought of as a sliding window of block demands. As indicated in FIG. 3, for rolling demand the time scale on the horizontal axis is still divided into individual intervals. However, the time scale is further divided into sub-intervals, as depicted. Instead of calculating the demand at the end of each interval, the calculation is performed by adding the consumption for a set number of sub-intervals and then dividing by the time period, in hours, of the composite interval. Rolling demand permits greater accuracy in demand billing. Total demand, average demand, maximum demand, and average maximum demand during a full interval are all types of demand billing that are supported by calculating rolling demands. Once the rolling demand is known, any of the aforementioned types of demand billing may be used.

Table 2 presents the same three cases as previously presented with respect to Table 1. Assuming that the demand sub-interval for billing is five minutes, the demand over the total hour billing period would be calculated for each interval with each interval being comprised of three successive five minute periods. Over the whole billing period, all demand value from these intervals will be compared with the largest one being used for billing purposes. As depicted in FIG. 3, the maximum demand is calculated in the eighth interval from the beginning of the one hour time period.

TABLE 2

Scenarios Showing Consumption and Demand Recorded by an Electric Meter for Different Power Levels and Times of Usage

|  | Case 1 | Case 2 | Case 3 |
|---|---|---|---|
| Constant Power Level | 1 kW | 2 kW | 12 kW |
| Time at Constant Power Usage | 60 minutes | 30 minutes | 5 minutes |
| Time at Zero Power Usage | 0 minutes | 30 minutes | 55 minutes |
| Total Time Period Evaluated | 1 hour | 1 hour | 1 hour |
| Consumption Value Registered at End of Time Period | 1 kWh | 1 kWh | 1 kWh |
| Demand Interval Period | 5 minutes | 5 minutes | 5 minutes |
| Max Consumption During Interval | 1 kWh | 2 kWh | 12 kWh |
| Maximum Demand Recorded at End of Time Period | 12 kW | 24 kW | 144 kW |

To find the maximum demand calculation for the same three cases that were presented with reference to Table 1, assume that the time interval commences at the start of the hour. With twelve distinct five minute demand sub-intervals throughout the hour, demand for each interval must be calculated. The calculations for the cases presented in FIG. 2 are simple since an assumption of level power consumption is made.

For case 1, each of the twelve minute sub-intervals would have the same demand value of 12 kW. Accordingly, the maximum demand for this case is 12 kW and the billing would be for 12 kWh.

For case 2, six of the intervals have a demand value of 24 kW while the remaining six intervals have a demand of 0 kW. So, for case 2, the maximum demand is 24 kW over the entire period of billing and the billing would be for 24 kWh.

For case 3, only one of the five minute intervals has a demand value of 144 kW. The other eleven have 0 kW demand. Accordingly, the maximum demand in this case is 144 kW and the customer would be billed 144 kWh for the hour.

The bold text in Table 2 compares the different billing approaches. From a straight consumption perspective, all three cases are billed the same as indicted in Table 1. However, when the demand is billed, it is clear that a maximum demand billing will distinguish the cases drawing heavy loads for relatively short periods. It shows the advantages to the electric utility for demand metering. The utilities typically desire this billing method since the cost of supplying energy to a customer depends on the needed capacity of the utility. This cost translates directly into demand.

We turn now to defining a time-of-use metering. Time-of-use metering records consumption during selected periods of time taken from a larger period of time. Typically the larger period of time is a day or a week. Rather than providing the utility with the capability to only charge the user for the energy used, rates structured on time-of-use information can account for when the energy is used. This allows utilities to charge premiums for energy drawn during peak periods (typically during the daytime) and provide lower rates for energy drawn during low usage periods (typically during nighttime).

Referring to FIG. 4, it is assumed that the utility has set up a two-rate time-of-use billing option. Rate A, the low rate, applies to energy drawn during the low usage periods. As depicted in FIG. 4, this occurs from 12:00 a.m. to 8:00 a.m. and from 6:00 p.m. to 12:00 a.m. Rate B, the high rate, applies to energy drawn during the high usage periods which, as depicted in FIG. 4, occur from 8:00 a.m. to 6:00 p.m. Utilization of this method for billing is relatively straightforward. For the depicted example day, from midnight to 8:00 a.m., 5 kWh of energy was used. Similarly, 20 kWh of energy was consumed from 8:00 a.m. until 6:00 p.m. Finally, from 6:00 p.m until the next midnight, 5 kWh of energy was used. Accordingly, the bill for this day will be based on 10 kWh at rate A, 20 kwh at rate B.

Time-of-use and demand metering both require a solid, reliable, and accurate time reference to support billing. An RF based system typically includes a meter transmitter or encoding device located at the site of the meter and a remote receiver or reading device. In an RF based system, the consumption message transmitted from the encoding device does not contain a time reference. A time reference is, however, typically stamped to the consumption message by the reading device as it is read by the reading device. This assures that the consumption sent was the consumption at the time of transmission and that the read device clock is accurate and reliable. It has been shown that an RF system will occasionally miss reading a transmission of a consumption message. System design allows for only a certain percentage of message read reliability, which is always less than 100%. Because of this, a typical compensation approach is to transmit multiple consumption messages at a time. This compensation approach typically transmits the last N consumptions recorded at the meter in predefined $t_A$ intervals. The reading device then decodes this message to have an accurate consumption history over the last N predefined $t_A$ intervals. Therefore, the reading device only needs to decode one out of every N transmissions in order to receive an accurate consumption message.

The aforementioned compensation approach is typically designed so that the desired reliability is achieved under normal operating conditions. The compensation approach adequately supports the advanced metering functions of time-of-use and demand billing. However, a problem exists when power is lost at the meter due to a power outage. Since there is no on-board time-of-day clock in the encoding device at the meter, there is no time reference available to be encoded. The encoding device is powered by the power at the meter that is being metered. Any counter in the encoding device shuts down when power is lost during a power outage.

This means that the consumption information transmitted by the encoding device has no reliable time reference with it. When the reading device detects and decodes the N consumption values, it can only accurately time stamp the most recent value. All the previous N−1 values cannot be reliably time stamped because, if a power outage has occurred, it is not known when the power outage occurred or the duration of the power outage. This greatly degrades the ability of such a system to support both time-of-use and demand billing in the presence of a power outage. Accordingly, there is a need in the industry for an RF based encoding device and associated receiving device that have the ability to support both time-of-use and demand billing, even in the presence of power outages observed at the meter.

SUMMARY OF THE INVENTION

The present invention has the capability of maintaining the time reference needed to support both demand and time-of-use billing by an electric utility with an RF based system. Since there are many millions of electrical meters currently in existence, any device that must be added to such a meter must have very low cost. Accordingly, the present invention is capable of supporting the advanced metering demanded by utilities with inexpensive component building blocks. Such building blocks include a microprocessor, an EE Prom, and simple power supplies. The present invention has the ability to accurately time stamp, without ambiguity, all consumption data in a period in which a single power outage is experienced. Further, the present invention has the ability to accurately time stamp, without ambiguity, some consumption data in a period in which multiple power outages occur. The present invention performs these functions with no need to synchronize clocks in the encoder device and in the read device. Additionally, the present invention performs these functions without the need to provide backup battery power at the meter to power a clock in the event of a power outage. The present invention has the ability to maintain power consumption history, as well as current consumption, through periods in which a power outage occurs.

The RF based communication system of the present invention includes a transmitter for transmitting a signal. The transmitter is powered by an external power source and has a transmitter counter for generating a count. The count is linearly incremented over time. The transmitted signal includes the count at the time that the signal is transmitted. A receiver is communicatively coupled to the transmitter for receiving the signal transmitted by the transmitter. The receiver has a receiver counter, the receiver counter being asynchronous with respect to the transmitter counter. The count of the receiver counter is also linearly incremented over time.

BRIEF DESCRIPTION OF THE DRAWINGS

FIG. 13 is a graph of count value on the ordinate and time on the abscissa depicting two power outages in a single interval.

DETAILED DESCRIPTION OF THE DRAWINGS

Figure 1:
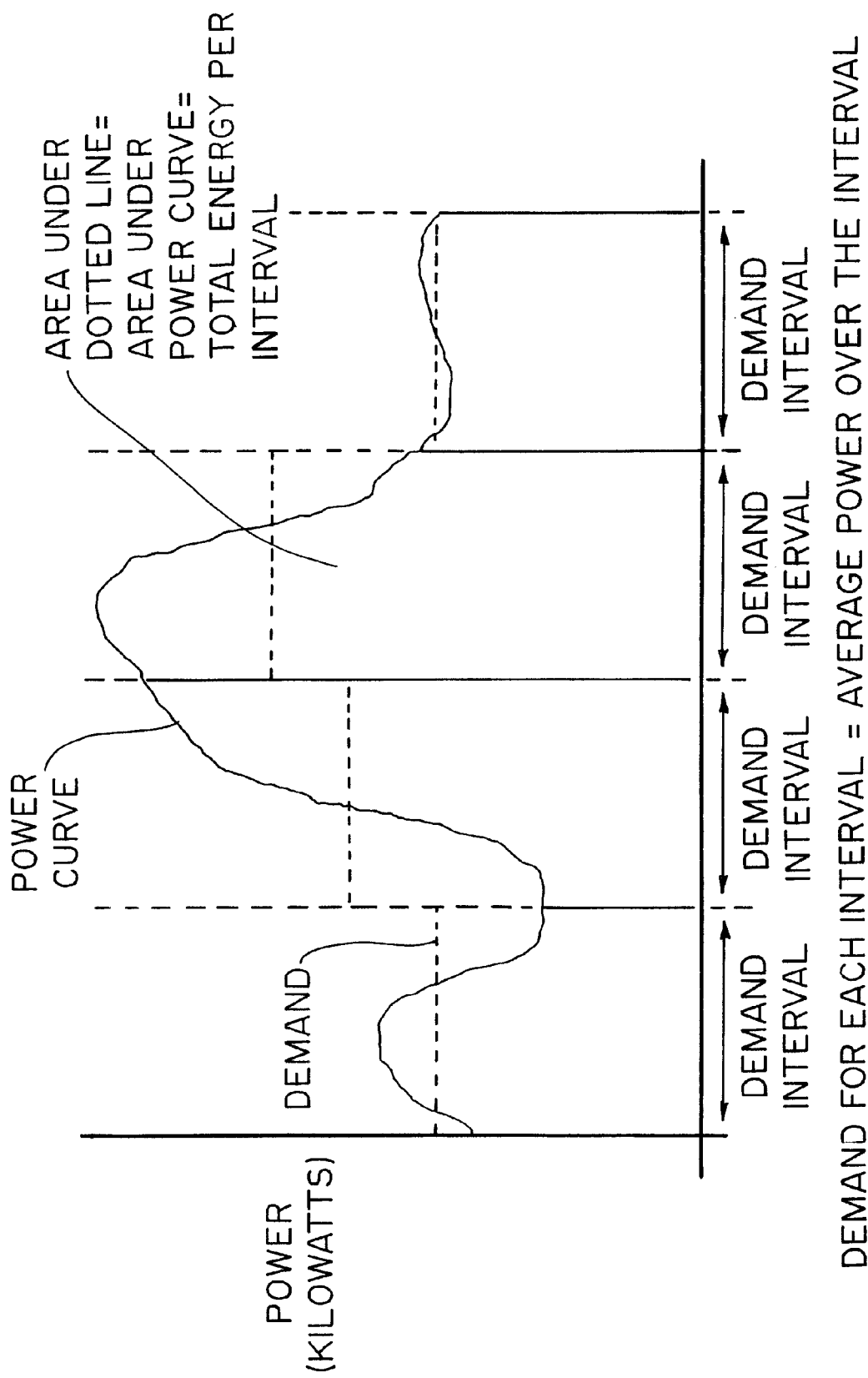
FIG. 1 is a graphic representation of power consumption with power represented on the ordinate and time represented on the abscissa.
Figure 2:
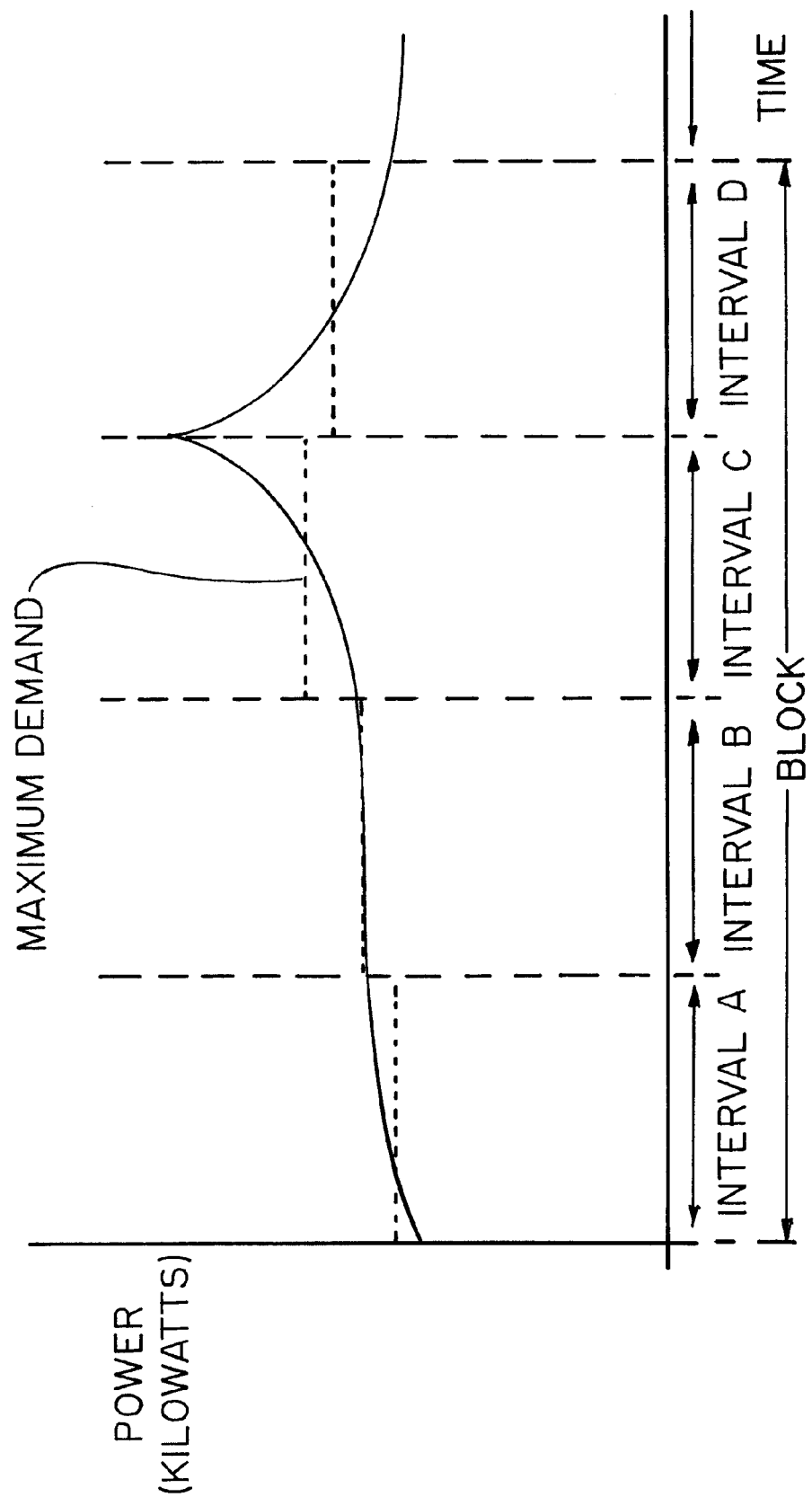
FIG. 2 is a graphic representation of power consumption with power represented on the ordinate and time represented on the abscissa depicting maximum demand billing over a block of time.
Figure 3:
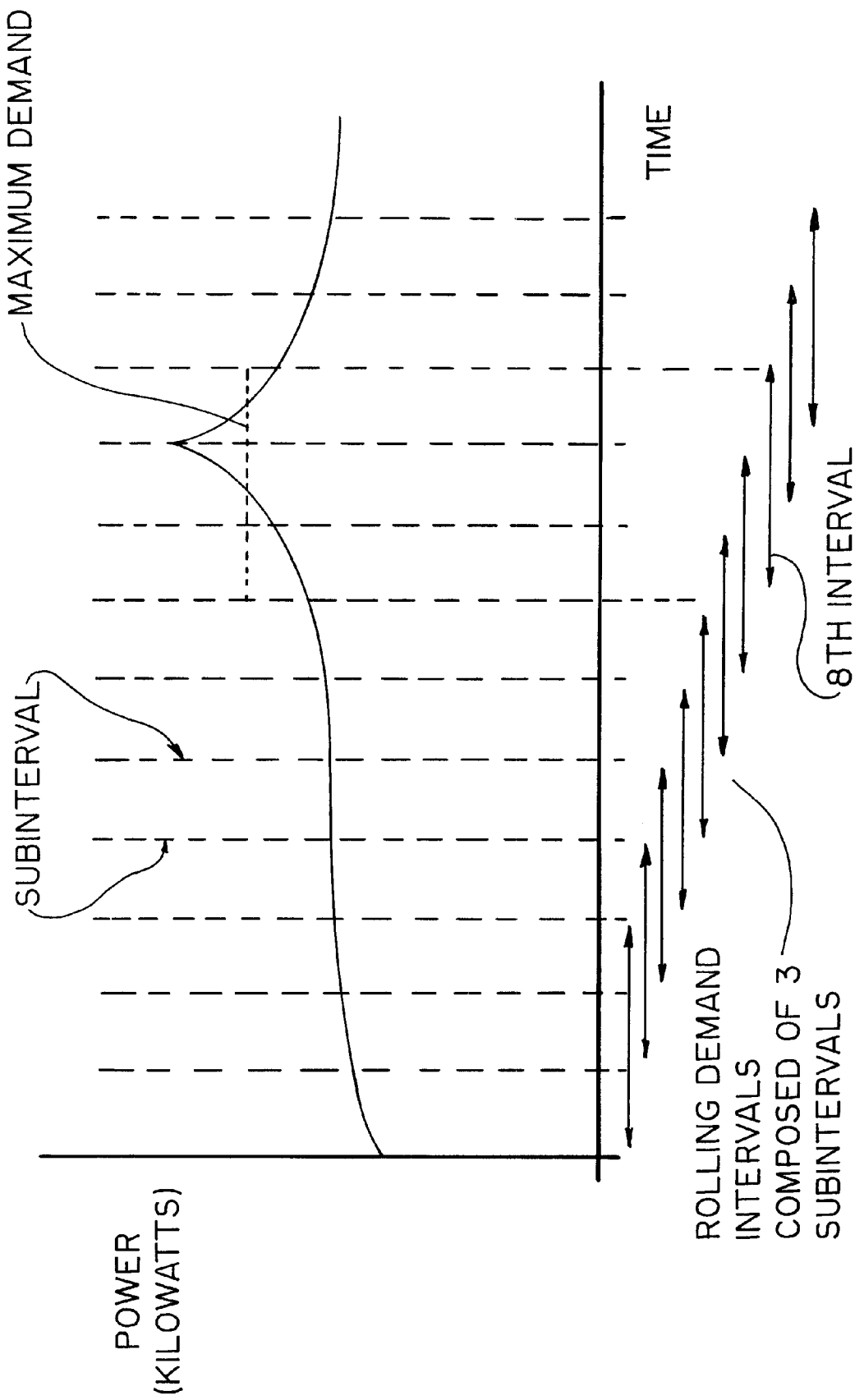
FIG. 3 is a graphic representation of power consumption with power on the ordinate and time on the abscissa depicting a rolling demand type billing calculation.
Figure 4:
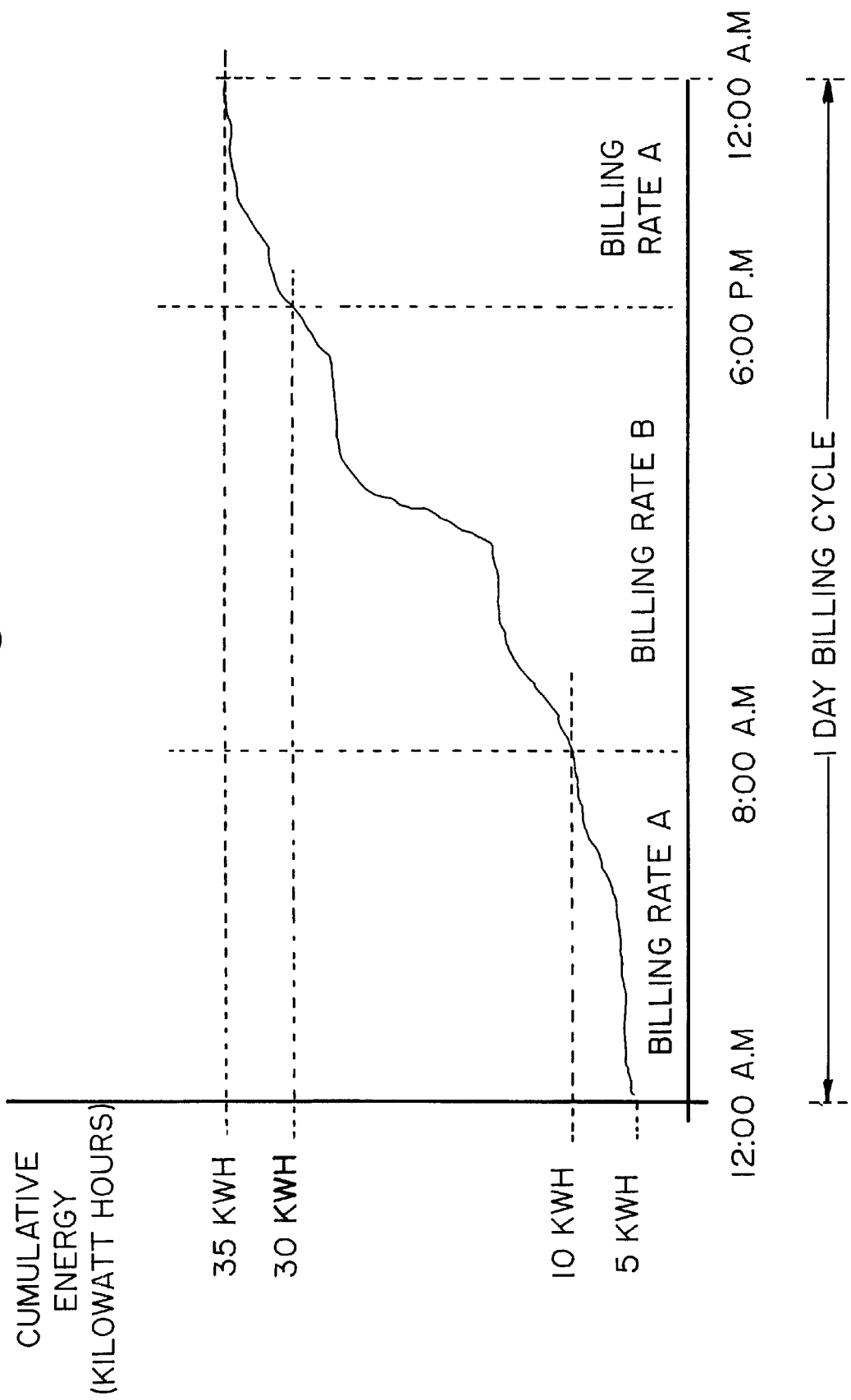
FIG. 4 is a graphic representation of power consumption with power on the ordinate and time on the abscissa depicting a time-of-use billing over a one day billing cycle.
Figure 5:
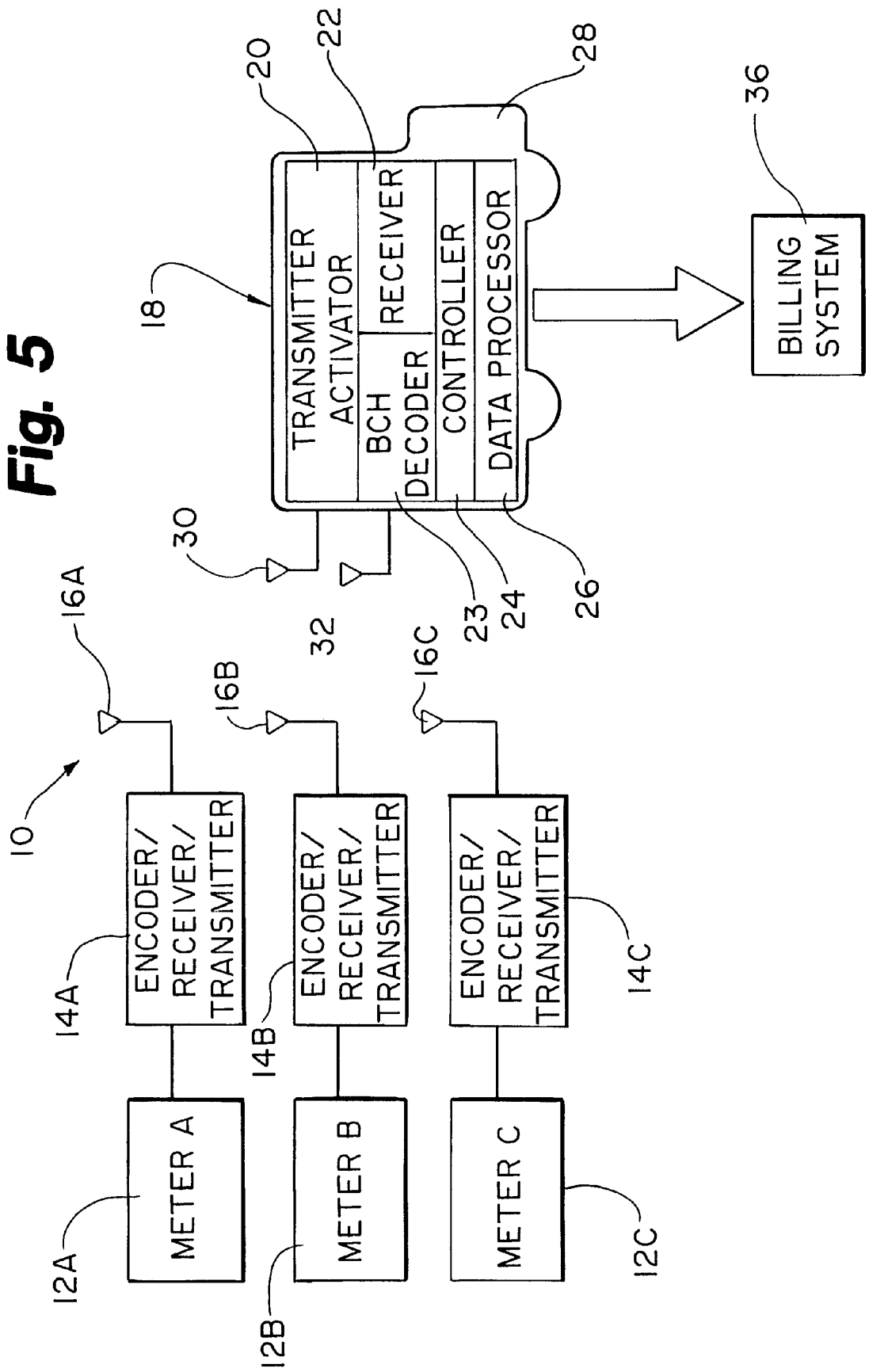
FIG. 5 is a schematic representation of the automatic/ remote RF instrument monitoring system of the present invention.

A communication system that is more particularly an automatic/remote RF instrument monitoring system is illustrated generally at 10 in FIG. 5. As shown, automatic/remote instrument monitoring system 10 is adapted for use with a plurality of remotely located parameter sensing instruments such as meters 12A–12C. Meters 12A–12C sense or monitor a physical parameter, such as a quantity of a given commodity (e.g. electrical power) used by a residential or business customer. The meters 12A–12C sense are also capable of sensing a power outage in the case where the meters 12A–12C sense are sensing electric power consumption.

Associated with and operatively coupled to each meter 12A–12C is a encoder 14A–14C. Each encoder 14A–14C is a transponder and includes an antenna 16A–16C, respectively, for receiving and transmitting radio frequency (RF) signals as well as a microprocessor, including a random access memory (RAM), an EEProm, and rather simple power supplies. It should be noted that the power supplies do not require battery backup power. Encoders 14A–14C accumulate and digitally store parameter data (including power outage) sensed by meters 12A–12C, respectively. Parameter data, as well as other account information such as identification data identifying meters 12A–12C from which the parameter data was sensed, is encoded for transmission in an RF encoder signal by encoders 14A–14C when the encoders 14A–14C activated, or polled.

Instrument monitoring system 10 also includes an interrogate/receiver device 18. Interrogate/receiver device 18 includes transmitter activator 20, receiver 22, which includes a decoder 23, controller 24, and data processor 26 which are preferably carried by a mobile vehicle 28 such as a van. In such other embodiments (not shown), interrogate/ receiver device 18 is stationary at a selected site with the reception area of the various encoders 14A–14C to which the interrogate/receiver device 18 is linked. Transmitter activator 20 transmits RF activation signals to encoders 14A–14C via antenna 30, while RF encoder signals from encoders 14A–14C are received by receiver 22 through antenna 32. Alternatively, the interrogate/receiver device 18 is internally scheduled to "bubble-up" a message without an external activation signal. In a preferred embodiment, the interrogate/receiver device 18 automatically sends a message every forty-five seconds.

Transmitter activator 20 of interrogate/receiver device 18 will generate a polling or activation signal which is transmitted through antenna 30. In the embodiment shown, vehicle 28 will proceed down a roadway, carrying interrogate/receiver device 18. All encoders 14A–14C within range of transmitter activator 30 will be activated, or "wake-up" upon receipt of the activation signal through their antennas 16A–16C. Alternatively, an interrogate/receiver device 18 is disposed at a fixed site within the reception range of the encoders 14A–14C and periodically receive the "bubble-up" messages therefrom.

Once activated, encoders 14A–14C produce and transmit their RF encoder signals which includes the parameter and identification data for N different $t_A$ intervals. The $t_A$ intervals are typically selected to be rather short, for example, 1.5, 2.5 or 5.0 minutes. The number of different intervals covered in a single transmission is a function of the design of the automatic/remote instrument monitoring system 10. In a preferred embodiment, N equals 48. Encoder signals are received by receiver 22, and the data contained therein is decoded. This data is then further processed, and stored, by data processor 26 under the control of controller 24. At some internally defined period, nominally daily, or after all meters 12A–12C have been read, all parameter, identification, and other account information is transferred to a utility billing system 36 through a storage medium, serial data interface, or other data transmission scheme. These and other features of instrument monitoring system 10 ar described in greater detail in the above-identified co-pending application.

Encoders 14A–14C all function in a similar manner, and are preferably identical to facilitate high volume, low cost construction. To this end, encoders 14A–14C can utilize a custom large scale integrated circuit, and only a few other components. All subsequent descriptions are therefore made with referenced to encoder 14A, which is representative of encoders 14A–14C.

A number of different compensations are designed into the present invention in order to permit the encoder device 14 to transmit information to the interrogate/receiver device 18 sufficient to satisfy the utilities' billing requirements for an interval in which at least one power outage occurs. The first such compensation deserves mention as it is a key to solving the overall problem. This compensation is to provide a power outage flag for each of the N different $t_A$ intervals. This flag is set if at least one power outage occurs in an interval. If there are not any power outages in an interval, the flag remains cleared. This first compensation applies to all types of billing used by the utilities, including time-of-use and demand billing.

Figure 6:
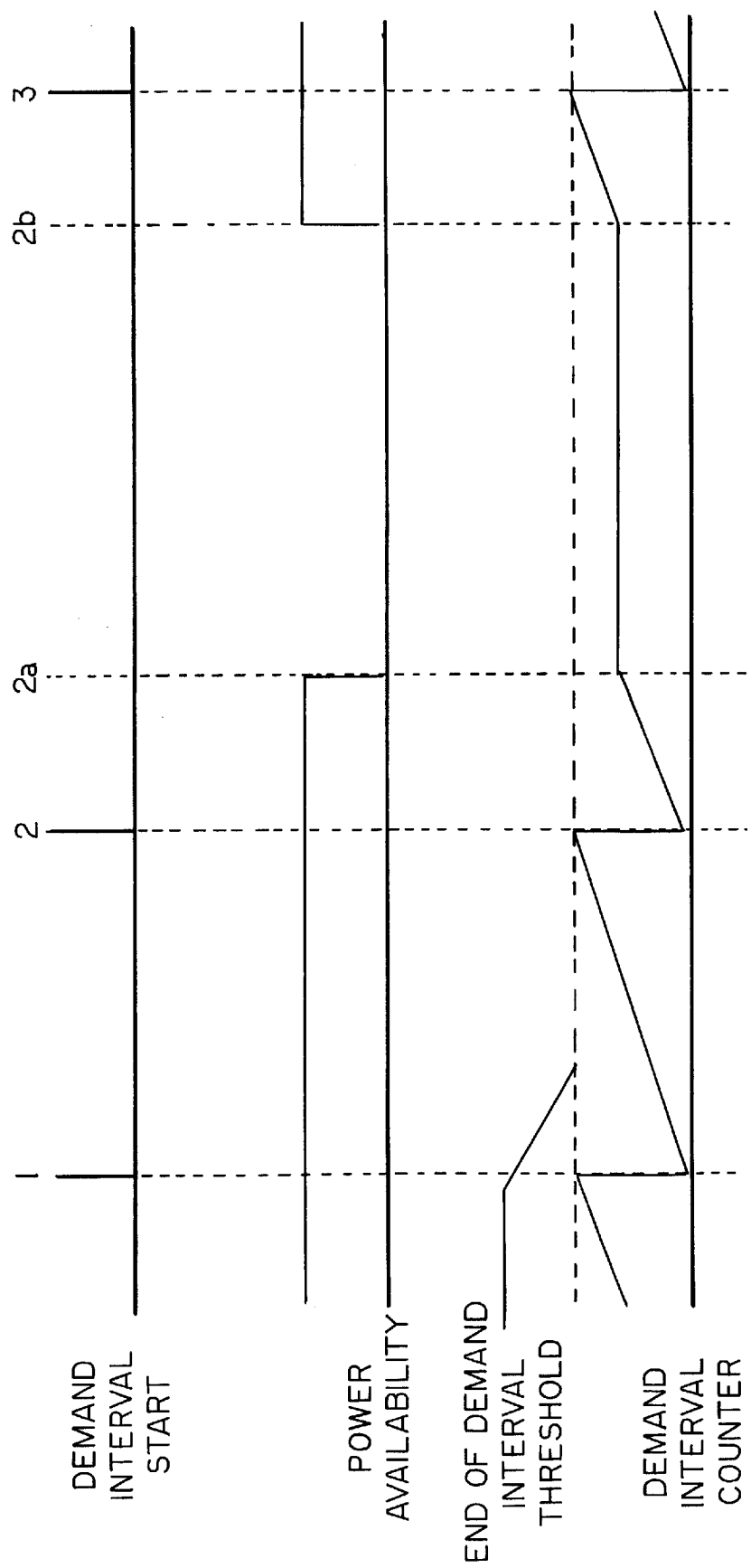
FIG. 6 is a graphic representation of the effect of a power outage on an interval in which power consumption data is recorded.

Demand metering compensations focus on ensuring that all of the N (in a preferred embodiment, N=48) consumption values are stored to non-volatile memory of the encoder 14 microprocessor between the time that power is first starting to droop and when power is totally lost. For pure demand billing (not combined with time-of-use), the demand interval is not defined by a time period on a clock, but rather by a time period for which power is available. Take the example of a demand interval $t_A$ A set at five minutes. If power is lost two and one-half minutes into the interval $t_A$, the interval $t_A$ will then end two and one-half minutes after power is eventually reapplied and the demand over the five minute interval and over the period of the power outage (in which there is no demand) is accurately sensed. This situation is diagrammed in FIG. 6. In interval 1, power is available and the interval terminates at a time that is equal to the time of the interval. In interval 2, a power outage occurs during the interval at 2a. Power is restored at 2b. The interval 2 is then extended (interval 2 equals the time from the interval start at 2 until the successive interval commences at 3) in real time by an amount of time equal to the duration of the power outage.

In order to maintain the string of consumption, the N values are written to non-volatile memory in the encoder device 14 each time that they are recalculated. This means that following recalculation, there will be a new N value, while the former N value is moved to the N–1 position, the old N–1 value in the N–2 position, the old N–2 value in the N–3 position, and so on.

There are two limitations to this approach. First and foremost, the non-volatile memory is reliable for only for a finite number of writes (in a known non-volatile memory, reliability exists for only one million writes). With consumption interval, $t_A$, at a typical value of 1¼ minutes, the non-volatile memory would only be reliable for about 2¼ years, that is, it would take only 2¼ years to write a million times. An electric meter must have much longer reliability to be acceptable.

The second limitation involves the required write time. It is likely that the overhead needed to rewrite the string of N values at every interval $t_A$ would unduly tax the microprocessor of the encoder device 14.

The solution to the problem presented by the aforementioned limitations borrows from the previously described approach of storing the new consumption data at every interval $t_A$. The key is to recognize that when the historical string of N data points is recalculated, only one value in that string changes. All the rest remain the same, but are moved back one location in the chain.

Figure 7:
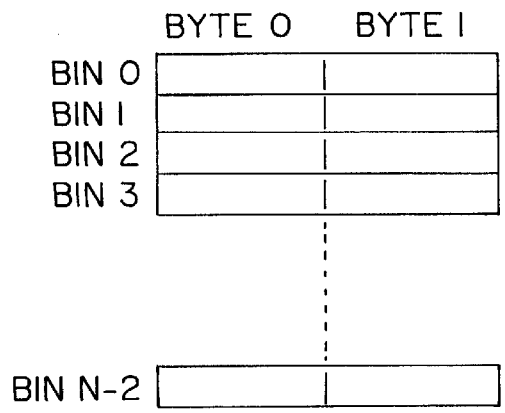
FIG. 7 is a representation of a buffer assigned in the nonvolatile memory of the encoder microprocessor.

To accomplish the desired task, a buffer is assigned in the non-volatile memory of the encoder 14 microprocessor. The length of the buffer equals (N–1). Each buffer position is wide enough to store the consumption data. In a preferred embodiment, the consumption data is stored differentially using nine bits. Given that the non-volatile memory in a preferred embodiment is only byte addressable, there needs to be two bytes allocated to each message. FIG. 7 shows the setup of the buffer. FIG. 7 depicts the bins as 0 through N–2 only for descriptive purposes. In total, this includes N–1 (preferably 47) bins. The Nth (48th) bin is the most recent full consumption bin, which is 24 bits long and allocated to memory outside of this buffer. The algorithm to store the consumption data uses this memory as a circular buffer.

Figure 8:
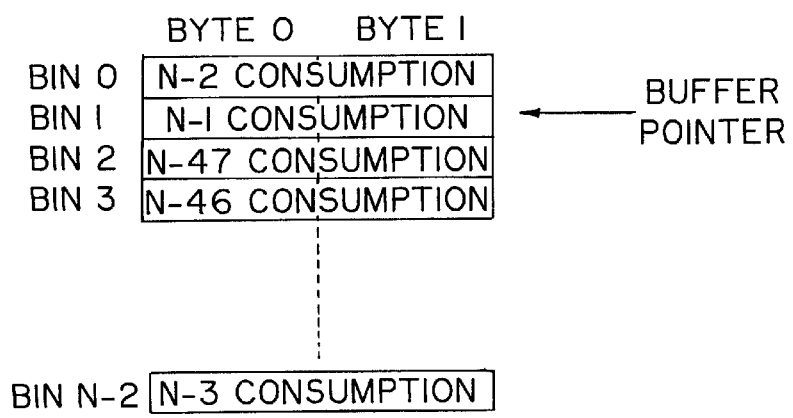
FIG. 8 depicts a pointer in the encoder microprocessor that indicates the encoded consumption value which occurred at the most recent interval.

A six bit pointer in the encoder 14 microprocessor indicates a position in the buffer. The pointer indicates the N–1 value, the differentially encoded consumption value which occurred at the most recent interval. The adjacent bins hold the N–2 value, the differentially encoded consumption at the 2nd most recent interval and the N–47 value, the differentially encoded consumption value which occurred forty-seven intervals prior. FIG. 8 depicts these relationships.

When the consumption interval ends, a new consumption value becomes the most recent. A new N–1 differential consumption value is calculated and all the existing historical differential consumption values shift their time reference down by one, e.g., N–6 becomes N–7. The existing N–47 value falls off of the list, being replaced by the previous N–46 value.

Figure 9:
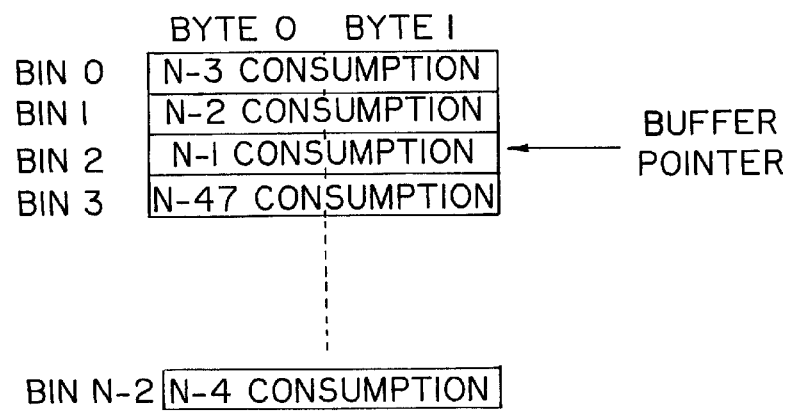
FIG. 9 depicts the pointer of FIG. 8 incremented by one bin.

Simply moving the pointer simplifies the shift process. As FIG. 9 shows, incrementing the pointer by one bin points to the old N–47 value. Replacing this value with the new N–1 value shifts the relative time position of all the other values by one bin without ever having to physically move any bits in memory, that is without ever having to rewrite any of the values, thereby substantially extending the reliability of the non-volatile memory. The moving pointer keeps the references appropriately aligned.

The biggest advantage in using this circular pointer is not in simplifying the shift process. It is in enhancing memory reliability. With the circular pointer it is easy to see that an individual memory location will only be written to once every N–1 intervals. This translates directly into the reliability of the device; if N–1 is twice as large, meaning you write to an individual memory address half as often, the device's lifetime increases by a factor of 2.

In this method, only the most recent full consumption value, which can be thought of as the N–0 value, is written to non-volatile memory at power loss. The 6 bit historical consumption buffer pointer is also written to non-volatile memory at power loss along with the aforementioned full consumption value.

Pure demand is provided with the aforementioned algorithm through power outages, as the current differential value is always stored to non-volatile memory. Additionally, as Table 3 shows, the reliability of the non-volatile memory exceeds any reasonable lifetime.

TABLE 3

Estimated Memory Lifetime Using Proposed Approach

| Differential Storage Interval, $t_\Delta$ | $t_\Delta$ Intervals per Year | Writes per Year* | Years per Failure** |
|---|---|---|---|
| 5 Minutes | 105120 | 2237 | 447 |
| 2.5 Minutes | 210240 | 4473 | 224 |
| 1.25 Minutes | 420480 | 8946 | 112 |

*Assuming N-1 = 47
**Based on a 1 Million Write Reliable non-volatile memory

In a preferred non-volatile memory, the non-volatile memory addresses only words and two bytes are allocated for each differential consumption storage. Since the differentiation is only nine bits long, this leaves seven bits unused. These bits may be used advantageously as desired to provide error correcting, checksums, etc. in order to enhance the reliability of the differential consumption message.

As discussed earlier the time dependence needed for tiine-of-use billing is different than for demand billing. Time-of-use rates transition at programmable times of the day. That means that there has to be adequate time resolution to place the differential consumption values into the proper time-of-use bin. A previous background discussion stated in general terms how to achieve this resolution under normal operation.

When power is lost, the interrogate/receiver device 18 does not know when the outage occurred or for how long it occurred, because there is no internal real time clock or battery backup in the encoder device 14. This becomes critical for time-of-use, as it leads to ambiguity in time stamping the N consumption intervals. Through the addition of the power outage flags discussed above, some of the ambiguity can be eliminated by identifying the interval in which the outage occurred.

This supports the simple means of providing time-of-use metering. It involves time stamping all of the interval data from the most recent consumption back to the interval where the first power outage occurred. For the intervals prior to the outage, an algorithm is used to classify the data into billable time-of-use bins.

Table 4 shows an example situation for binning the time-of-use data using this method. The algorithm chosen for the example states that any consumption data which cannot be time stamped gets assigned to the same time-of-use bin as the bin in which the earliest time stamped consumption value occurred. For this example, that means the non-time stamped values go into the same time-of-use bin as the N–2 sample. The potential for error is shown by comparing the Actual time-of-use Bin and the Billed time-of-use Bin columns. In the depicted case, a power outage occurs during the N–3 interval and the time-of-use bin transitions from the B rate to the A rate during the N–4 interval. The consumption in the N–4 to N–47 intervals should be billed at the A rate but are in fact billed at the B rate due to the ambiguity introduced by the power outage that occurs in the N–3 interval.

TABLE 4

Example of TIME-OF-USE Binning Through Power Outage Using Simple Algorithm

| Historical Consumption Value | Power Outage? 0 = No 1 = Yes | Able to Time Stamp the Interval Data? | Actual TIME-OF-USE Bin | Billed TIME-OF-USE Bin | Billing Error? |
|---|---|---|---|---|---|
| Current | 0 | Yes | B | B | NO |
| N-1 | 0 | Yes | B | B | NO |
| N-2 | 0 | Yes | B | B | NO |
| N-3 | 1 | No | B | B | NO |
| N-4 | X | No | A | B | YES |
| N-5 | X | No | A | B | YES |
| . | " | " | " | " | " |
| . | " | " | " | " | " |
| . | " | " | " | " | " |
| N-46 | X | No | A | " | " |
| N-47 | X | No | A | B | YES |

X = Don't Care State

Additional functionality is achieved using a more complex approach to the time-of-use billing problem in the presence of a power outage. It will be shown that this approach, known as "Time-of-use Metering with Asynchronous Counters," preserves time-of-use billing unambiguously in scenarios where only one outage occurs on the string of N consumption values. If multiple outages occur, the consumption values in the string prior to the first outage and after the last outage can be unambiguously time stamped. Intermediate values cannot be time stamped and need a special algorithm to classify their billing periods.

"Time-of-use Metering with Asynchronous Counters" is born from the fact that the encoder device 14 has no battery backup and no clock that is actively synchronized to a clock in the interrogate/receiver device 18. "Time-of-use Metering with Asynchronous Counters" accomplishes time synchronization with the reading technology in the interrogate/receiver device 18 in a passive manner. A counter is used in both the encoder device 14 and in the interrogate/receiver device 18. The encoder device 14 counter and the interrogate/receiver device 18 counter are not synchronized. They are asynchronous.

Figure 10:
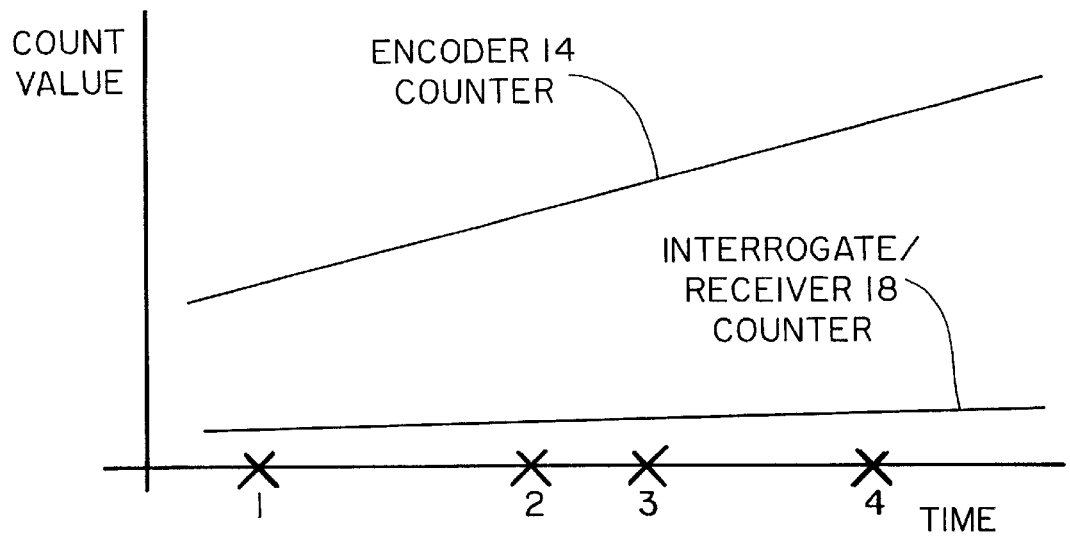
FIG. 10 is a graphic representation having count value on the ordinate and time on the abscissa depicting the different slopes of the encoder counter and the interrogate/receiver counter.

For "Time-of-use Metering with Asynchronous Counters" each individual encoder device 14a–14c transmits the count value of its counter along with its history of consumption messages. The following paragraphs discuss how combining this counter with the power outage flags allows for the prediction of the outage duration, where and when the first power outage started, and where and when the last power outage ended. The diagram in FIG. 10 depicts the encoder device 14 counter and the interrogate/receiver device 18 counter in use under normal power conditions. The slopes of the encoder device 14 counter and the interrogate/receiver device 18 counter selected are arbitrary and could as well be reversed or the slopes of the encoder device 14 counter and the interrogate/receiver device 18 counter could be the same.

The algorithm for "Time-of-use Metering with Asynchronous Counters" works as follows. At the time denoted in FIG. 10 as 1, 2, 3, and 4, the interrogate/receiver device 18 decoded a valid message from the encoder device 14. With the value of the interrogate/receiver device 18 counter at these samples, the interrogate/receiver device 18 uses the encoder device 14 counter to determine the time slope of the encoder device 14 counter.

At each received sample point, the slope of the encoder device 14 counter, its last received count, and the corresponding interrogate/receiver device 18 counter are stored by the interrogate/receiver device 18. Knowing this information, for each subsequent received sample from the encoder device 14, the counter value of the encoder device 14 counter can be predicted by the interrogate/receiver device 18. To enhance robustness, a rolling average approach may be used.

Figure 11:
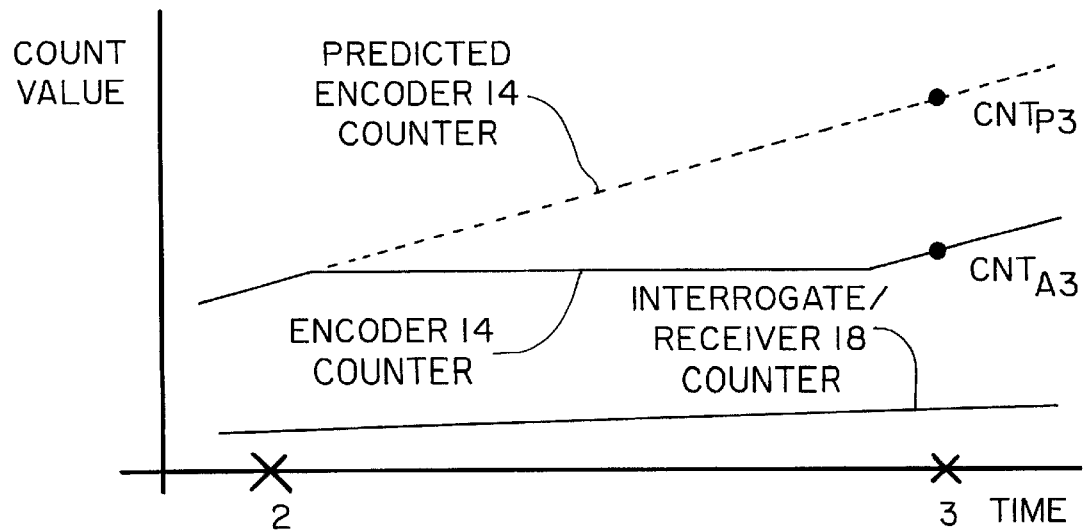
FIG. 11 depicts the impact of a power outage on the counters depicted in FIG. 10.

Assume the situation in which a power outage condition has occurred somewhere between samples 2 and 3. FIG. 11 depicts the counter performance in this situation. The interrogate/receiver device 18 receives the Encoder device 14 message at time 3. It uses the stored slope, the encoder device 14 counter, and the interrogate/receiver device 18 counter values from the last read (at time 2) to predict the expected encoder device 14 counter at time 3, $CNT_{P3}$. This value is then compared to the actual value of the encoder device 14 counter at time 3, $CNT_{A3}$. A difference in the counters indicates that an outage occurred. This is double checked by investigating the power outage flags, indicating the occurrence of at least one power outage.

The total power outage time can be found from the difference between these two counters. The mathematics show:

$\Delta$RC=Interrogate/receiver device 18 Counter Count Difference Between $CNT_{P3}$ and $CNT_{A3}$ $M_E$=Encoder Device 14 counter Async Count-Line Slope Referred to Interrogate/receiver device 18 Counter $T_{ORC}$=Power Outage Duration, Referred to the Interrogate/receiver device 18 Counter $T_O$=Power Outage Duration, Referred to Real Time $$CNT_{A2} + \Delta RC \times M_E = CNT_{P3} \qquad (1)$$

$$CNT_{A2} + (\Delta RC - T_{ORC}) \times M_E = CNT_{A3} \qquad (2)$$

Algebraically operating on (1) and (2) leads to:

$$\frac{(CNT_{P3} - CNT_{A3})}{M_E} = T_{ORC}$$

If the interrogate/receiver device 18 counter is designed to very closely approximate real time, $T_{ORC}=T_O$. If not, another similar calculation needs to be made to convert $T_{ORC}$ to real time.

Figure 12:
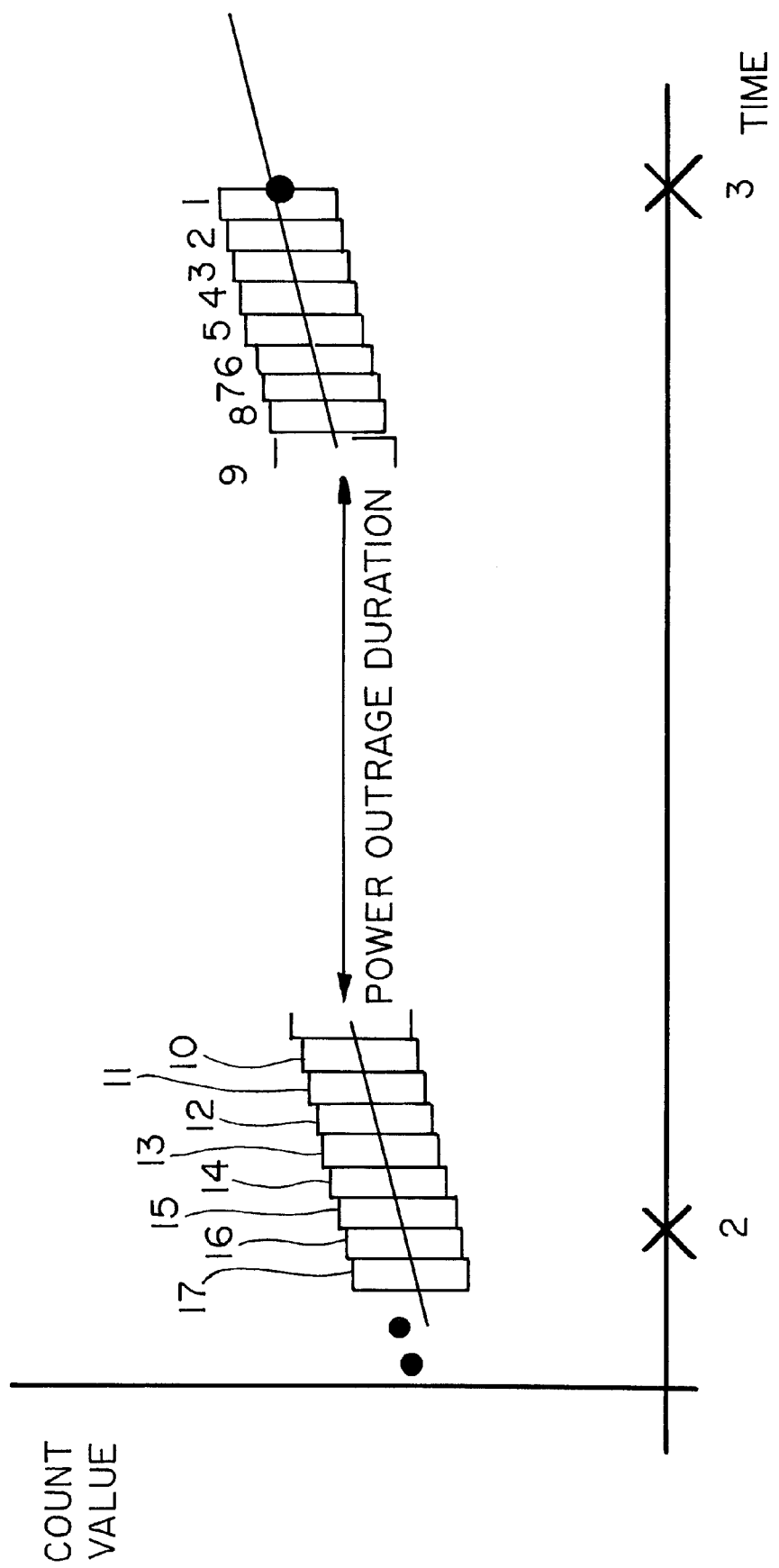
FIG. 12 is a graph of count value on the ordinate and time on the abscissa depicting a single power outage occurring in the ninth sub-interval of a consumption interval.

An example serves best to describe the time stamping algorithm. First, take the case where only one outage occurred in the string of N consumption values. This is shown in FIG. 12. The example will show that for the case of only one outage within the N samples, all interval s can be unambiguously time stamped.

For simplicity, only the first 17 of the N consumption interval s are shown in FIG. 12. In the example, a single power outage occurs. It happens within the interval marked 9. For this interval, the power outage flag will be set.

A time outage can be attached to all interval s 1–8 if the interval duration, $t_A$, is known a priori {1.25 min, 2.5 min, 5.0 min}. This is readily done by back tracking from the time at which the message was received.

Previous discussions showed how the total outage time, $T_O$, can be determined. Subtracting the sum of this value and the duration of one interval from the time where interval 8 started gives the time at the beginning of interval 9 or equivalently, the time at the end of interval 10. From thereon, the remaining interval s can be time tagged.

Time at Start of Interval 8
− Time Duration of Outage
− Interval Duration
---
Time at Start of Interval 9

The only ambiguity is the actual time within interval 9 where the power was lost. Since the overall interval length, $t_A$, is either chosen from {1.25 min, 2.5 min, 5.0 min}, the ambiguity is relatively small. However, it is suggested that this ambiguity fully meets specified performance.

In order to meet the specified performance, assume the system operates over a given period without any power outages. With the same choice of consumption interval s, the time-of-use rate transition can happen anywhere within the interval. The system will use a market acceptable technique to determine where the consumption data within that interval will be billed. The same algorithm applies in the single power outage case.

If a time-of-use rate transition occurs within the interval of power outage, from a consumption point of view no more potential consumption could occur in this interval than in an interval of no power outage. This must be the case since power is applied over the same duration even though the time duration may be much longer. Therefore, the same error exists in billing independent of power outage.

A potentially more serious case arises incident to multiple outages that occur in a given interval. This may introduce some ambiguity. FIG. 13 shows the counter performance in case of multiple outages.

Just as in the one outage case, the total power outage time period can be determined by comparing the predicted counter value at time 3 to the actual counter value. It can be shown that the difference between the predicted and actual encoder device 14 counters can be used to predict the total power outage duration. The prediction is independent of the number of outages.

Referring to the example of FIG. 13, interval s 3 and 9 have their power outage flags set, indicating that a power outage has occurred at both interval s 3 and 9. The interval s in time after (1, 2) and before (10, 11 . . . ) can be easily time stamped. Interval s 1 and 2 can be time stamped by back tracking from the message receipt time. The mathematics needed to determine the start of interval 9 are shown by the following equation:

Time at Start of Interval 2
− Time Duration of Outage
− 2 × Interval Duration
− 5 × Interval Duration
---
Time at Start of Interval 9

The "2" in the above formulation is the number of interval s containing a power outage and the "5" is the number of full interval s between power outages.

Now that the start of interval 9 is known, all preceding interval s can be time tagged. As stated earlier, there is too much ambiguity to accurately time stamp the interval s between the power outages. A presumably market-acceptable approach for dealing with the ambiguity is to add up all of the consumption in this ambiguous region and spread it evenly throughout the ambiguous region. Time outages are known for the beginning and end of the outage so is then easily determined over that period and applied to the proper time-of-use rate. For insurance, the interrogate/ receiver device 18 then sends along an estimation flag to the billing system 30 to alert the billing system 30 at the electric utility that the actual data was not known.

What is claimed is:

1. An RF based communication system, comprising:
   transmitter means for transmitting a signal, being powered by an external power source and having a transmitter counter for generating a count that is linearly incremented over time, the transmitted signal including the count at the time that the signal is transmitted; and
   receiver means being communicatively coupled to the transmitter means for receiving the signal transmitted by the transmitter means, having a receiver counter, the receiver counter being asynchronous with respect to the transmitter counter.

2. The RF based communication system of claim 1 wherein the receiver means includes a microprocessor, the microprocessor calculating the slope of the incrementally increasing count of the transmitter counter.

3. The RF based communication system of claim 2 wherein the microprocessor calculates a predicted count for the transmitter counter at a selected count of the receiver counter.

4. The RF based communication system of claim 1 wherein the receiver means and the transmitter means are passively time synchronized by comparing the counts of the asynchronous receiver counter and the transmitter counter.

5. The RF based communication system of claim 3 wherein the microprocessor calculates the difference between the predicted count of the transmitter counter and the count of the transmitter counter, the difference providing an indication of the occurrence of a power outage in the external power source and the duration of said power outage.

6. A metering communication system for communicating data related to metered consumption of electrical energy to provide support for time-of-use and demand billing in the presence of at least one power outage event, the metering communication system being communicatively coupled to a sensor for sensing power consumption and for sensing power outage events, the sensor generating a sensor output signal having data related to at least the sensed power consumption and to power outage events, the metering communication system comprising:
   a. an encoder device having;
      means for communication with the sensor for receiving the sensor output signal therefrom; and
      means for periodically generating an encoded RF signal for transmission by the encoder device, the signal having a power outage flag associated therewith, the flag being set responsive to the sensor output signal including data related to a power outage event; and
   b. an interrogate/receiver device having;
      decoder means being communicatively coupled to the encoder device for decoding the encoded RF signal received from the encoder device; and
      data transfer means for transferring the decoded RF signal to a billing system.

7. The metering system of claim 6 wherein the encoded RF signal has a plurality of discrete components, each of said components being related to electrical power consumption during a selected interval of time, a power outage flag being associated with each discrete component.

8. The metering system of claim 7 wherein the encoder device is powered solely by the electrical power being metered.

9. The metering system of claim 7 wherein the encoder device includes encoder counter means for incrementally increasing a count as a function of time.

10. The metering system of claim 9 wherein the interrogate/receiver device includes receiver counter means for incrementally increasing a count as a function of time, the receiver counter means being asynchronous with respect to the encoder counter means.

11. The metering system of claim 10 wherein the receiver counter means counts at a rate substantially equal to a real time counter.

12. The metering system of claim 10 wherein the interrogate/receiver device flags the decoded RF signal received from the encoder device prior to transmission to a billing system for each interval in which the consumption of electrical energy is estimated.

13. The metering system of claim 10 wherein the interrogate/receiver device determines the difference between a predicted and an actual encoder counter means count to predict a total power outage duration.

14. The metering system of claim 13 wherein the interrogate/receiver device determines the difference between a predicted and an actual encoder counter means count to predict a total power outage duration of a plurality of power outages.

15. The metering system of claim 14 wherein the encoder device includes a microprocessor, the microprocessor having a buffer assigned in a non-volatile memory, a pointer in the microprocessor indicating a position in the buffer corresponding to a N−1 consumption value, the N−1 consumption value being a differentially encoded consumption value which occurred at a most recent consumption interval.

16. The metering system of claim 15 wherein the pointer is incremented to identify each newly received N−1 consumption value.

17. The metering system of claim 16 wherein the buffer has N−1 bins, each of said bins having a differential consumption value stored therein and being written to once every N−1 intervals.

18. The metering system of claim 17 wherein the most recently received differential consumption value displaces the oldest consumption value in the buffer, the pointer incrementing by one to indicate the most recently received differential consumption value at the time of displacement.

19. The metering system of claim 18 wherein the most recently arrived full consumption value and the buffer pointer are written to non-volatile memory at the time of a power outage.

20. A metering communication system for communicating data related to metered consumption of electrical energy to provide support for demand billing in the presence of at least one power outage event, the metering communication system being communicatively coupled to a sensor, the sensor for sensing power consumption and for sensing power outage events, the sensor generating a sensor output signal having data related to at least the sensed power consumption and to power outage events, the metering communication system comprising:
   a. an encoder device having;
      means for communication with the sensor for receiving the sensor output signal therefrom;
      a microprocessor, the microprocessor having a buffer assigned in a non-volatile memory, a pointer in the microprocessor indicating a position in the buffer corresponding to a N−1 consumption value, the N−1 consumption value being a differentially encoded consumption value which occurred at a most recent consumption interval; and
      means for periodically generating an encoded RF signal for transmission by the encoder device; and b. an interrogate/receiver device having;
  decoder means being communicatively coupled to the encoder device for decoding the encoded RF signal received from the encoder device; and
  data transfer means for transferring the decoded RF signal to a billing system.

21. The metering system of claim 20 wherein the pointer is incremented to identify each newly received N−1 consumption value.

22. The metering system of claim 21 wherein the buffer has N−1 bins, each of said bins having a full consumption value stored therein and being written to once every N−1 intervals.

23. The metering system of claim 22 wherein the most recently received differential consumption value displaces the oldest consumption value in the buffer, the pointer incrementing by one to indicate the most recently received differential consumption value at the time of displacement.

24. The metering system of claim 23 wherein the most recently arrived full consumption value and the buffer pointer are written to non-volatile memory at the time of a power outage.

25. The metering system of claim 24 wherein the encoded RF signal has a power outage flag associated therewith, the flag being set responsive to the sensor output signal including data related to a power outage event.

26. A metering communication system for communicating data related to metered consumption of electrical energy to provide support for time-of-use billing in the presence of at least one power outage event, the metering communication system being communicatively coupled to a sensor for sensing power consumption and for sensing power outage events, the sensor generating a sensor output signal having data related to at least the sensed power consumption and to power outage events, the metering communication system comprising:
  a. an encoder device having;
    means for communication with the sensor for receiving the sensor output signal therefrom;
    encoder counter means for incrementally increasing a count as a function of time; and
    means for periodically generating an encoded RF signal for transmission by the encoder device, the encoded RF signal having the current count of the encoder counter means associated therewith; and
  b. an interrogate/receiver device having;
    decoder means being communicatively coupled to the encoder device for decoding the encoded RF signal received from the encoder device;
    receiver counter means for incrementally increasing a count as a function of time, the receiver counter means being asynchronous with respect to the encoder counter means; and
    data transfer means for transferring the decoded RF signal to a billing system.

27. A metering communication system as claimed in claim 26 the count of the encoder counter means related to the count of the receiver counter means providing passive synchronization of the encoder device and the interrogate/receiver device for time stamping data related to the sensed power consumption.

28. The metering system of claim 26 wherein the receiver counter means counts at a rate substantially equal to a real time counter.

29. The metering system of claim 26 wherein the interrogate/receiver device flags the decoded RF signal received from the encoder device prior to transmission to a billing system for each interval in which the consumption of electrical energy is estimated.

30. The metering system of claim 26 wherein the interrogate/receiver device determines the difference between a predicted and an actual encoder counter means count to predict a total power outage duration.

31. The metering system of claim 30 wherein the interrogate/receiver device determines the difference between a predicted and an actual encoder counter means count to predict a total power outage duration of a plurality of power outages.

* * * * *

UNITED STATES PATENT AND TRADEMARK OFFICE
CERTIFICATE OF CORRECTION

PATENT NO : 6,006,212
DATED : December 21, 1999
INVENTOR(S) : Schleich

It is certified that error appears in the above-identified patent and that said Letters Patent is hereby corrected as shown below:

Column 1, line 20, after "review" insert --of--.

Column 3, Table 2, the following should be in bold:

| | | | |
|---|---|---|---|
| Consumption Value Registered at End of Time Period | 1 kWh | 1 kWh | 1 kWh |
| Maximum Demand Recorded at End of Time Period | 12 kW | 24 kW | 144 kW |

Column 3, line 44, delete "indicted" and insert --indicated--.

Column 6, lines 14 and 16, delete "sense".

Column 6, line 32, after "14C" insert --are--.

Column 6, line 63, delete "includes" and insert --include--.

Column 7, line 11, delete "ar" and insert --are--.

Column 7, line 18, delete "referenced" and insert --reference--.

Column 7, line 64, after "only" delete "for".

Column 9, line 28, delete "tiine" and insert --time--.

Column 11, line 11, delete "Encoder" and insert --encoder--.

UNITED STATES PATENT AND TRADEMARK OFFICE
CERTIFICATE OF CORRECTION

PATENT NO : 6,006,212

DATED : December 21, 1999

INVENTOR(S) : Schleich

It is certified that error appears in the above-identified patent and that said Letters Patent is hereby corrected as shown below:

Column 11, line 44, delete "=" and insert --≅--.

Column 11, lines 51, 55, 58 and 67, delete "interval s" and insert --intervals--.

Column 11, line 59, "a priori" sold be in italics.

Column 12, lines 15, 39, 41-43, 55-57, 59 and 60, delete "interval s" and insert --intervals--.

Signed and Sealed this

Twenty-first Day of November, 2000

Attest:

Q. TODD DICKINSON

*Attesting Officer*  *Director of Patents and Trademarks*